US007856545B2

(12) United States Patent
Casselman (10) Patent No.: US 7,856,545 B2
(45) Date of Patent: Dec. 21, 2010

(54) FPGA CO-PROCESSOR FOR ACCELERATED COMPUTATION

(75) Inventor: Steven Casselman, Sunnyvale, CA (US)

(73) Assignee: DRC Computer Corporation, Sunnyvale, CA (US)

( * ) Notice: Subject to any disclaimer, the term of this patent is extended or adjusted under 35 U.S.C. 154(b) by 727 days.

(21) Appl. No.: 11/829,801

(22) Filed: Jul. 27, 2007

(65) Prior Publication Data

US 2008/0028186 A1 Jan. 31, 2008

Related U.S. Application Data

(60) Provisional application No. 60/820,730, filed on Jul. 28, 2006.

(51) Int. Cl.
*G06F 15/00* (2006.01)
*G06F 15/76* (2006.01)

(52) U.S. Cl. ....................................................... 712/34

(58) Field of Classification Search ..................... 712/34
See application file for complete search history.

(56) References Cited

U.S. PATENT DOCUMENTS

| 6,961,841 | B2 * | 11/2005 | Huppenthal et al. | ............ | 712/34 |
|---|---|---|---|---|---|
| 7,210,022 | B2 * | 4/2007 | Jungck et al. | .................. | 712/34 |
| 7,386,704 | B2 * | 6/2008 | Schulz et al. | ................. | 712/15 |
| 2004/0250046 | A1 | 12/2004 | Gonzalez | | |
| 2005/0027970 | A1 | 2/2005 | Arnold | | |
| 2008/0028187 | A1 | 1/2008 | Casselman et al. | | |

FOREIGN PATENT DOCUMENTS

| WO | PCT/US2007/074660 | 7/2008 |
|---|---|---|
| WOWO | PCT/US2007/074661 | 7/2008 |
| WO | WO 2008/014493 A3 | 10/2008 |

OTHER PUBLICATIONS

Blume et al.; Integration of High-Performance ASICs into Reconfigurable Systems Providing Additional Multimedia Functionality; 2000; IEEE.*

(Continued)

*Primary Examiner*—Eddie P Chan
*Assistant Examiner*—Corey Faherty
(74) *Attorney, Agent, or Firm*—The Webostad Firm (57) ABSTRACT

A co-processor module for accelerating computational performance includes a Field Programmable Gate Array ("FPGA") and a Programmable Logic Device ("PLD") coupled to the FPGA and configured to control start-up configuration of the FPGA. A non-volatile memory is coupled to the PLD and configured to store a start-up bitstream for the start-up configuration of the FPGA. A mechanical and electrical interface is for being plugged into a microprocessor socket of a motherboard for direct communication with at least one microprocessor capable of being coupled to the motherboard. After completion of a start-up cycle, the FPGA is configured for direct communication with the at least one microprocessor via a microprocessor bus to which the microprocessor socket is coupled.

14 Claims, 6 Drawing Sheets

OTHER PUBLICATIONS

Fawcett; Taking Advantage of Reconfigurable Logic; 1994; IEEE.*
Blume etal.; Integration of High-Performance ASICs Into Reconfigurable Systems Providing Additional Multimedia Functionality; 2000; IEEE.
Letter from Jody Bishop to Steve Casselman dated Nov. 26, 2008.
Letter from Jody Bishop to Steve Casselman dated Dec. 16, 2008.
Maya Gokhale & Paul S. Graham, Reconfigurable Computing: Accelerating Computation with Field-Programmable Gate Arrays, 2003, pp. 4-5, The Netherlands, Springer Pub.
Jeffrey M. Arnold, Duncan A .Buell, Dzung T. Hoang, Daniel V. Pryor, Nabeel Shirazi, Mark R. Thistle, The Splash 2 Processor and Applications, 1993, pp. 282-285, IEEE.
XSA Board V1.1, V1.2 User Manual, Jun. 23, 2005, XESS Corporation.
XSA-50 Spartan-2 Prototyping Board with 2.5V, 50,000-gate FPGA, 1998-2008, XESS, from http:...www.xess.com/prod027.php3.

* cited by examiner

FPGA CO-PROCESSOR FOR ACCELERATED COMPUTATION

This application claims benefit to U.S. provisional patent application No. 60/820,730, entitled "FPGA Co-Processor for Accelerated Computation," filed Jul. 28, 2006, which is herein incorporated by reference in its entirety.

FIELD

One or more embodiments generally relate to accelerators and, more particularly, to a co-processor module including a Field Programmable Gate Array ("FPGA").

BACKGROUND

Co-processors have often been used to accelerate computational performance. For example, early microprocessors were unable to include floating-point computation circuitry due to chip area limitations. Doing floating-point computations in software is extremely slow so this circuitry was often placed in a second chip which was activated whenever a floating-point computation was required. As chip technology improved, the microprocessor chip and the floating-point co-processor chip were combined together.

A similar situation occurs today with specialized computational algorithms. Standard microprocessors do not include circuitry for performing these algorithms because they are often specific to only a few users. By using an FPGA (field programmable gate-array) as a co-processor, an algorithm can be designed and programmed into hardware to build a circuit that is unique for each application, resulting in a significant acceleration of the desired computation.

SUMMARY

One or more embodiments generally relate to accelerators and, more particularly, to a co-processor module including a Field Programmable Gate Array ("FPGA").

A co-processor module for accelerating computational performance includes a Field Programmable Gate Array ("FPGA") and a Programmable Logic Device ("PLD") coupled to the FPGA and configured to control start-up configuration of the FPGA. A non-volatile memory is coupled to the PLD and configured to store a start-up bitstream for the start-up configuration of the FPGA. A mechanical and electrical interface is for being plugged into a microprocessor socket of a motherboard for direct communication with at least one microprocessor capable of being coupled to the motherboard. After completion of a start-up cycle, the FPGA is configured for direct communication with the at least one microprocessor via a microprocessor bus to which the microprocessor socket is coupled.

BRIEF DESCRIPTION OF THE DRAWINGS

Accompanying drawing(s) show exemplary embodiment(s) in accordance with one or more embodiments; however, the accompanying drawing(s) should not be taken to limit the invention to the embodiment(s) shown, but are for explanation and understanding only.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well-known features have not been described in detail so as not to obscure the invention. For ease of illustration, the same number labels are used in different diagrams to refer to the same items; however, in alternative embodiments the items may be different. Furthermore, although particular integrated circuit parts are described herein for purposes of clarity by way of example, it should be understood that the scope of the description is not limited to these particular numerical examples as other integrated circuit parts may be used.

A multi-processor system consists of several processing chips connected to each other by high-speed busses. By replacing one or more of these processor chips by application-specific co-processors, it is often possible to obtain a significant acceleration in computational speed. Each co-processor sits in the motherboard socket designed for a standard processor and makes use of motherboard resources.

According to one embodiment, the co-processor FPGA is located on a module which plugs into a standard microprocessor socket. Motherboards are commonly available which have multiple microprocessor sockets, allowing one or more standard microprocessors to co-exist with one or more co-processor modules. Thus, no changes to the motherboard or other system hardware are required, making it easy to build co-processor systems. The co-processor has access to motherboard resources including large amounts of memory. These resources need not be duplicated on the co-processor module, reducing the cost, size and power requirements for the co-processor. The co-processor is connected to the main processor by one or more high-speed low-latency busses. Many algorithms require frequent communication between the main microprocessor and the co-processor, making this interface a factor in achieving high performance.

According to another embodiment, to accelerate computational algorithms, a co-processor module is included which plugs into a standard microprocessor socket on a motherboard and communicates with the microprocessor by one or more high-speed, low-latency busses. The co-processor has access to motherboard resources through the microprocessor socket. The co-processor includes an FPGA which is reconfigurable and may be loaded with a new configuration pattern suitable for a different algorithm under control of the microprocessor. The configuration pattern is developed using a set of software tools. The co-processor module capabilities may be extended by adding additional piggyback cards.

An another embodiment is an accelerator module, including an FPGA and a Programmable Logic Device ("PLD")

coupled to the FPGA and configured to control start-up configuration of the FPGA. A non-volatile memory is coupled to the PLD and configured to store a start-up bitstream for the start-up configuration of the FPGA. A mechanical and electrical interface is configured for being plugged into a microprocessor socket of a motherboard for direct communication with at least one microprocessor capable of being coupled to the motherboard. After completion of a start-up cycle, the FPGA is configured for direct communication with the at least one microprocessor via a microprocessor bus to which the microprocessor socket is coupled.

Another embodiment generally is an accelerator system, comprising a first motherboard having accelerator modules and a second motherboard having at least one microprocessor. Each of the accelerator modules includes an FPGA and a Programmable Logic Device ("PLD") coupled to the FPGA and configured to control start-up configuration of the FPGA. A non-volatile memory is coupled to the PLD and configured to store a start-up bitstream for the start-up configuration of the FPGA. A mechanical and electrical interface is configured for being plugged into a microprocessor socket of the first motherboard for direct communication as between the accelerator modules. The microprocessor socket is coupled to a microprocessor bus for the direct communication between the accelerator modules.

Yet another embodiment generally is a method for co-processing. An accelerator module is coupled to a microprocessor bus, the accelerator module including a Field Programmable Gate Array ("FPGA"). A microprocessor bus interface bitstream is loaded into the FPGA to program programmable logic thereof. Data is transferred to first memory of the accelerator module via a microprocessor bus using a microprocessor bus interface instantiated in the FPGA responsive to the microprocessor bus interface bitstream. A default configuration bitstream stored in the first memory is instantiated in the FPGA to configure the FPGA to have the microprocessor bus interface with sufficient functionality to be recognized by a microprocessor coupled to the microprocessor bus.

Still yet another embodiment generally is another method for co-processing. An accelerator module, which includes a Field Programmable Gate Array ("FPGA") and first memory, is coupled to a microprocessor bus. The first memory has a default configuration bitstream stored therein. The default configuration bitstream is loaded into the FPGA to program programmable logic thereof. The default configuration bitstream includes a microprocessor bus interface. The FPGA is configured with the default configuration bitstream with sufficient functionality to be recognized by a microprocessor coupled to the microprocessor bus.

Figure 1:
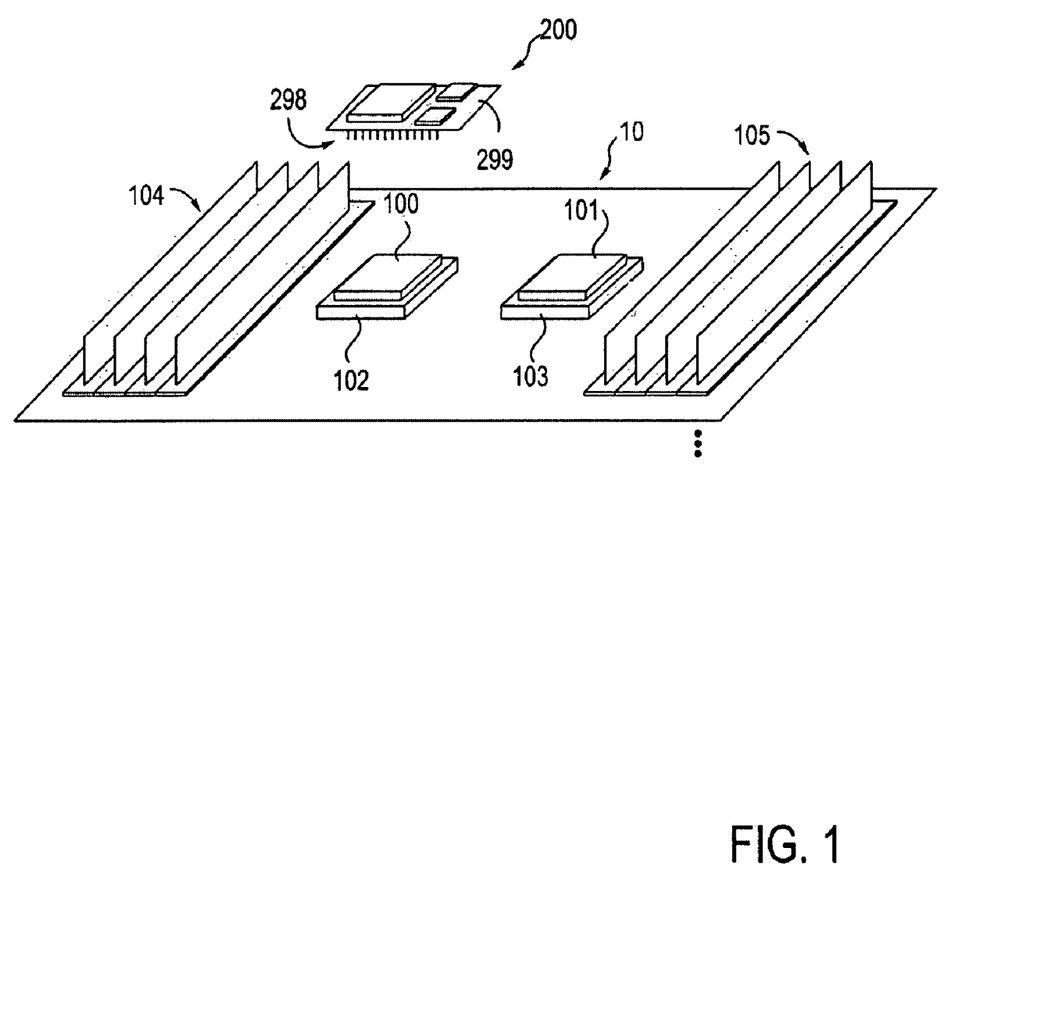
FIG. 1 is a diagram of an exemplary co-processor module which may be coupled to a motherboard with two processor sockets, according to one embodiment.

Referring to FIG. 1, a multiprocessor motherboard 10 is shown containing two processor chips 100 and 101 and DRAM modules 104 and 105. In one embodiment, the processor chips are Opteron microprocessors available from Advanced Micro Devices (AMD) although processors available from other companies such as Intel could also be used. A typical motherboard also contains many other components which are omitted here for clarity. In one embodiment, the K8SRE (S2891) motherboard from Tyan Computer Corporation is used although many other suitable motherboards are available from this and other vendors. Motherboards are available with various numbers of processor chips 100, 101. Typically, a motherboard contains between one and eight processor chips. In one embodiment, a motherboard with sockets for at least two processor chips is required. One or more processor chips 100, 101 are removed and replaced with co-processor modules 200. If the motherboard contains more than two processor chips, several of them may be replaced with co-processor modules 200 providing that at least one processor chip remains on the motherboard.

It is also possible to build high performance computing systems with multiple motherboards interconnected by high speed busses. In such a system, some of the motherboards may contain only co-processor modules while other motherboards contain only processor chips or a mixture of processor chips and co-processor modules. In such a multi-board system, there must be at least one processor chip in order to communicate with one or more co-processor modules.

Returning now to FIG. 1, processor chips 100, 101 are attached to motherboard 10 using sockets 102, 103 which allow them to be easily removed. Co-processor module 200 has the same mechanical and electrical interface via circuit board 299 and pins 298 as processor chips 100, 101 allowing easy replacement with minimal or no changes to motherboard 10. Motherboard 10 also contains memory modules 104 which are normally coupled for communication with a processor chip 100 plugged in socket 102. Memory modules 105 are similarly coupled for communication with a processor chip 101 plugged in socket 103. When processor chip 100 is replaced by co-processor 200, co-processor 200 has access to memory modules 104.

Figure 2:
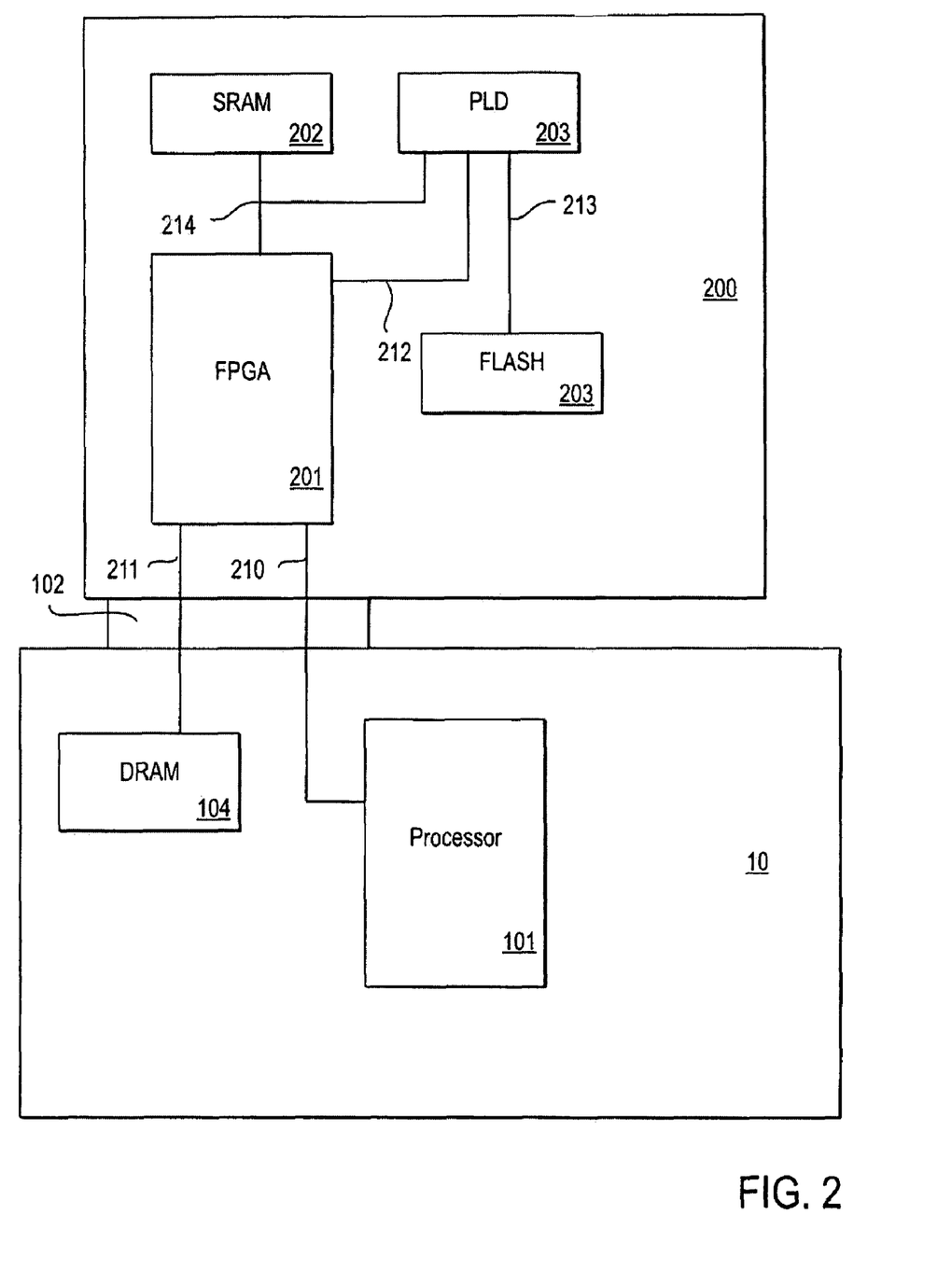
FIG. 2 is a block diagram of an exemplary co-processor module, including major components and busses, according to one embodiment.

Referring now to FIG. 2, a block diagram of co-processor module 200 is shown in more detail, along with its connections to motherboard 10. Co-processor module 200 contains FPGA (field-programmable gate array) 201, SRAM (static random access memory) 202, PLD (programmable logic device) 203 and flash memory 204, along with other components such as resistors, capacitors, buffers and oscillators which have been omitted for clarity. In one embodiment, FPGA 201 is an XC4VLX60FF668 available from Xilinx corporation although there are numerous FPGAs available from Xilinx and other vendors such as Altera which would also be suitable. SRAM 202 may be a IDT71T75602S20BG from Integrated Device Technology corporation, PLD 203 may be an EPM7256BUC169 from Altera corporation and flash memory 204 may be a TC58FVM5T2AXB65 from Toshiba corporation, according to one embodiment. In each case, there are numerous alternative components which could be used instead. FPGA 201 is connected through bus 211 and socket 102 to the motherboard memory module 104. It is also connected through bus 210 and socket 102 to the remaining motherboard processor chip 101. In one embodiment, bus 210 is a hypertransport bus. The hypertransport bus has high bandwidth and low latency characteristics for example with respect to availability to processor 101, although other busses such as PCI, PCI Express or RapidIO could be used instead with the appropriate motherboard components. The hypertransport bus, which is a point-to-point bus, also forms a direct connection between processor 101 and co-processor module 200 without passing through any intermediate chips or busses. This direct connection greatly improves throughput and latency when transferring data to the co-processor.

FPGA 201 also connects to SRAM 202 and PLD 203 via bus 214. PLD 203 additionally connects to flash memory 204 via bus 213 and to FPGA 201 via programming signals 212.

Figure 3:
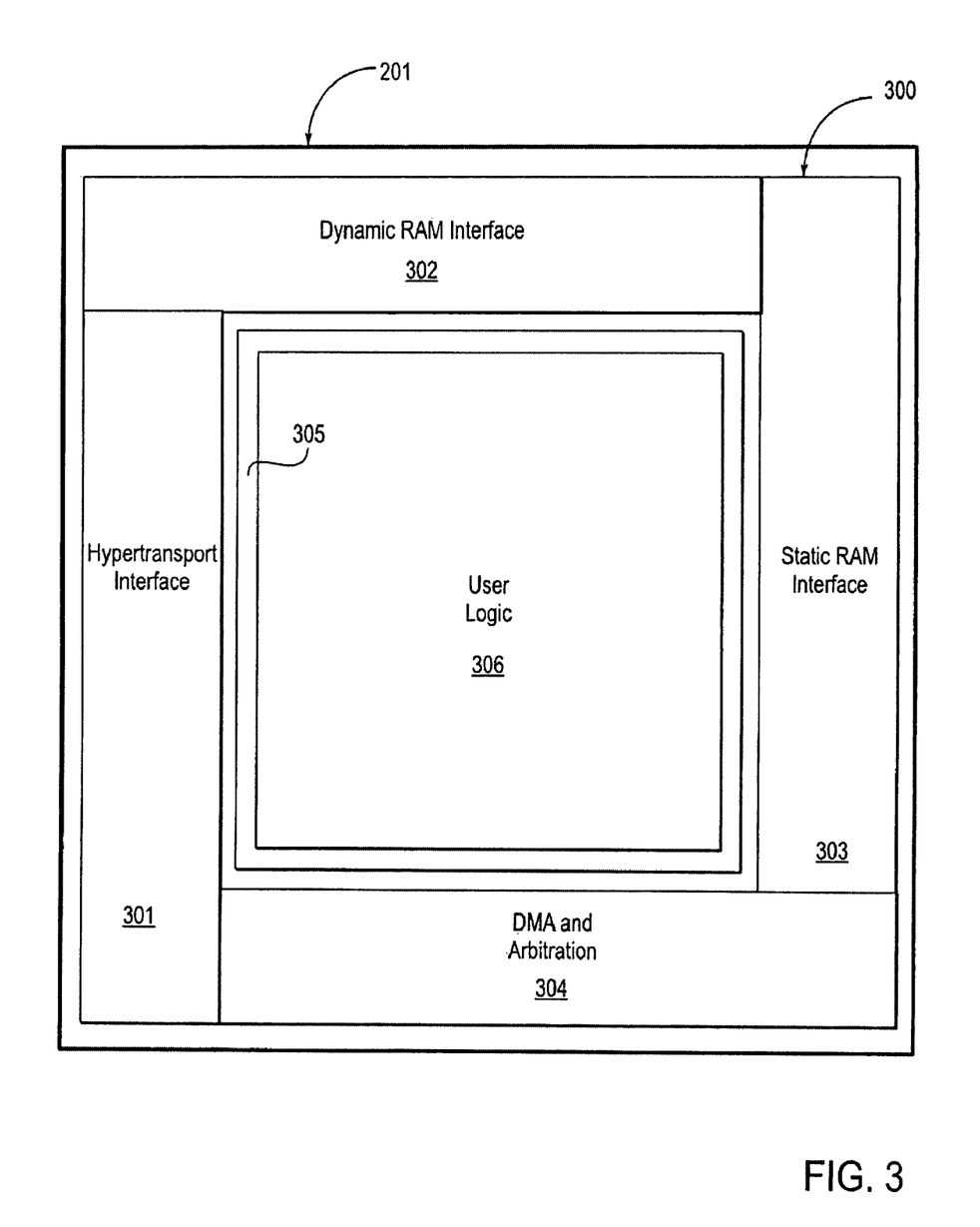
FIG. 3 is a block diagram of an exemplary layout of internal functions of the co-processor FPGA, according to one embodiment.

Referring now to FIG. 3, the internal logic of FPGA 201 is described. An FPGA is a device which may be programmed to perform various logical functions. FPGA 201 is reprogrammable so it may perform a first set of logical functions, then, after reprogramming, a second set of logical functions. This allows different algorithms to be programmed depending on the needs of a particular customer or application. The logical function of FPGA 201 is divided into two portions. Customer-specific algorithms are programmed into the user logic section 306 of FPGA 201. In addition to user logic 306, the FPGA includes a set of interface or support functions 300. In one embodiment, these support functions 300 are: a hypertransport interface 301, a DDR (double data-rate) DRAM (dynamic random-access memory) interface 302, a static RAM (random access memory) interface 303 and a DMA and arbitration function 304. These support functions 300 are connected to user logic 306 by standard wrapper interface 305. The wrapper interface 305 is designed to present a consistent view of support functions 300 so additional functions may be added or functions may be changed internally without the need to change user logic 306. The user logic portion of FPGA 201 may also be reprogrammed to represent different algorithms while the support functions 300 continue to operate. This is necessary since many functions such as hypertransport interface 301 and DDR memory interface 302 cannot be interrupted without a long restart procedure.

Figure 4:
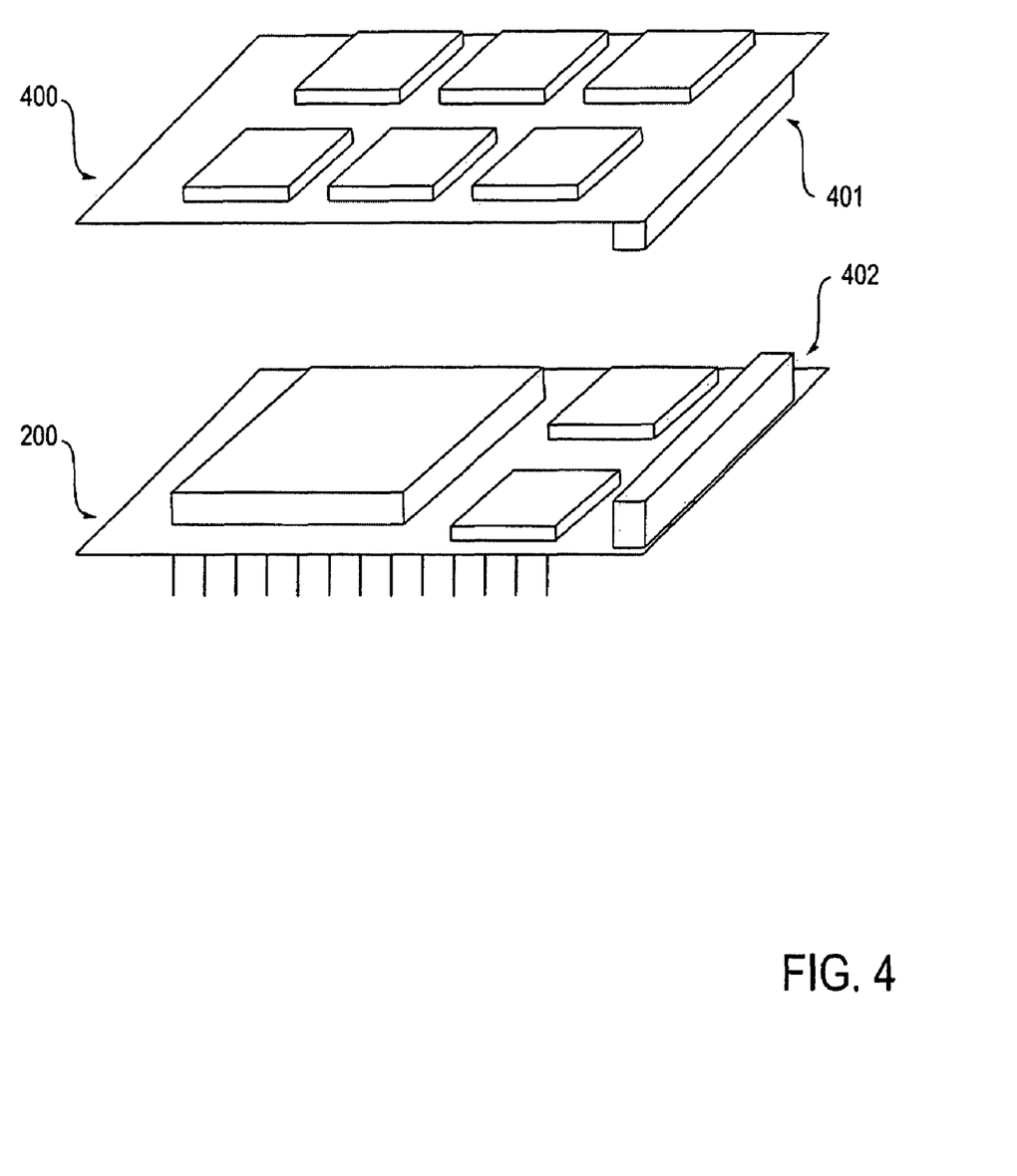
FIG. 4 is a diagram of an exemplary expanded co-processor module with a daughter card containing additional logic functions, according to one embodiment.

The physical size of module 200 is limited because of the need to fit into socket 102 without interfering with other components which may exist on motherboard 10. At the same time, it is desirable to be able to expand the functionality of module 200 to support various applications. Expanded functionality may include, for example, additional memory or additional hypertransport interfaces. FIG. 4 shows how module 200 may be expanded by adding a daughter card 400 which includes additional components. The daughter card 400 is attached to module 200 by connectors 401, 402.

Figure 5:
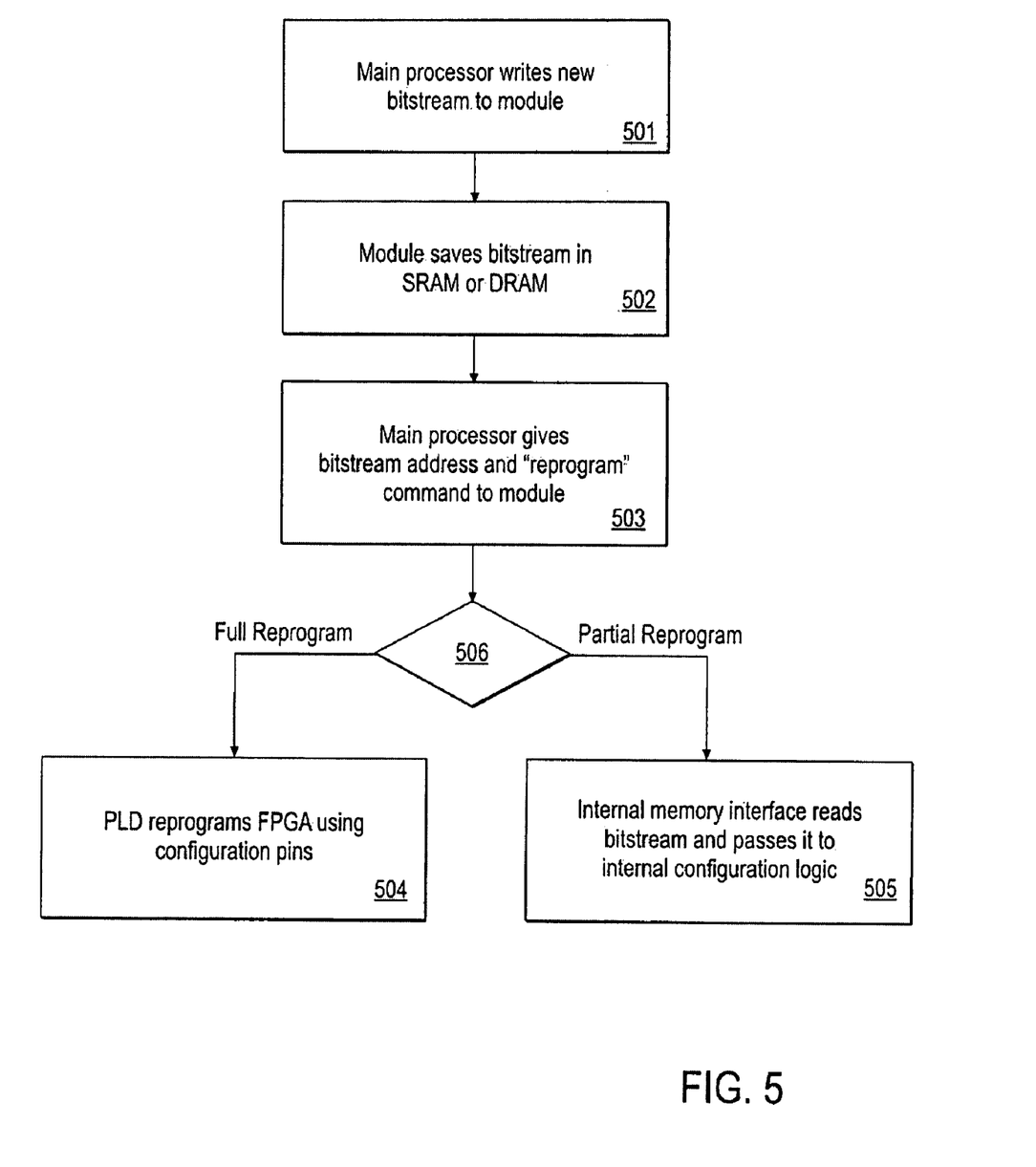
FIG. 5 is a flowchart showing a method for partially or fully reprogramming a co-processor module from SRAM, according to one embodiment.

Referring now to FIG. 5, the process of configuring FPGA 201 on module 200 is described with renewed reference to FIGS. 1-3. When power is initially supplied or the processor reset signal is applied, FPGA 201 is programmed automatically from flash memory 204. FPGA 201 may also be reprogrammed automatically from flash memory 204 if it ceases to operate due to various conditions. Monitor logic is built into FPGA 201 and PLD 203 which checks for correct operation of FPGA 201 and initiates reprogramming if it senses a fault condition. The programming and reprogramming processes are controlled by PLD 203. Xilinx and others supply logic circuits and detailed instructions for programming an FPGA from a flash memory. In order to initially program flash memory 204, a configuration pattern is loaded into FPGA 201 using a JTAG connector on module 200. This configuration pattern is sufficient to operate hypertransport interface 301. Hypertransport interface 301 is then used to transfer data to flash memory 204 under control of PLD 203. Flash memory 204 normally contains a default FPGA configuration for support functions 300 that is sufficient to operate the hypertransport interface 301, memory interfaces 302, 303 and DMA and arbitration function 304 but does not include configuration information for user logic 306. PLD 203 is initially configured using a JTAG (Joint Test Action Group standard 1149.1) connector on module 200. Alternatively, flash memory 204 and PLD 203 may be initially loaded with a default configuration before being soldered onto module 200. Flash memory 204 and PLD 203 may be reloaded while FPGA 201 is operating, by transferring new data over hypertransport interface 301. Flash memory 204 is intended to provide semi-permanent storage for the default FPGA configuration and is changed infrequently. PLD 203 provides basic support functions for module 200 and is also changed infrequently.

Once the default configuration pattern (bitstream) is loaded into FPGA 201, module 200 becomes visible over the hypertransport bus to a main processor 101 in the system. At 501, the main processor transfers a new configuration pattern over hypertransport bus 210 for writing to FPGA 201 of module 200. This new configuration pattern typically contains a user logic function 306 and may also contain new definitions for support functions 300. At 502, FPGA 201 of module 200 saves the new configuration pattern into either SRAM or DRAM using the memory interfaces 302 or 303. If full reconfiguration of FPGA 201 is planned, the configuration pattern must be saved into SRAM. DRAM cannot be used for full reconfiguration because the configuration data would be lost when DRAM interface 302 ceases to operate during the configuration process. SRAM may be controlled using PLD 203 instead of SRAM interface 303 in FPGA 201 so the configuration data is retained while FPGA 201 is reprogrammed. The processors 501 and 502 may operate concurrently since the amount of data required to configure. FPGA 201 may be very large. At 503, main processor 101 uses the hypertransport bus to send FPGA 201 of module 200 the address of the configuration pattern in SRAM or DRAM, along with a command to reprogram itself. A decision 506 is then made whether to do full or partial reconfiguration.

During partial reconfiguration, support functions 300 remain active and only enough data must be transferred over hypertransport bus 210 to configure user logic 306. This allows partial reconfiguration to be much faster than full reconfiguration, making partial reconfiguration the preferred alternative in most situations. Data for partial reconfiguration may be saved in either DRAM or SRAM. When module 201 is used to accelerate computational algorithms, frequent reconfiguration is often necessary and reconfiguration time becomes a limiting factor in determining the amount of acceleration that may be obtained. Partial reconfiguration at 505 involves FPGA 201 loading the reconfiguration data, where an internal memory interface of FPGA 201 is used to read a bitstream and pass it to user logic 306. After loading is complete, new logic functions specified by the new configuration become active and may be used.

If full reconfiguration is desired at 504 of FIG. 5 PLD 203 takes over control of SRAM 202, erases FPGA 201 and transfers a complete new configuration pattern to FPGA 201. This is similar to initial programming except that the configuration data comes from SRAM 202 instead of flash memory 204

Figure 6:
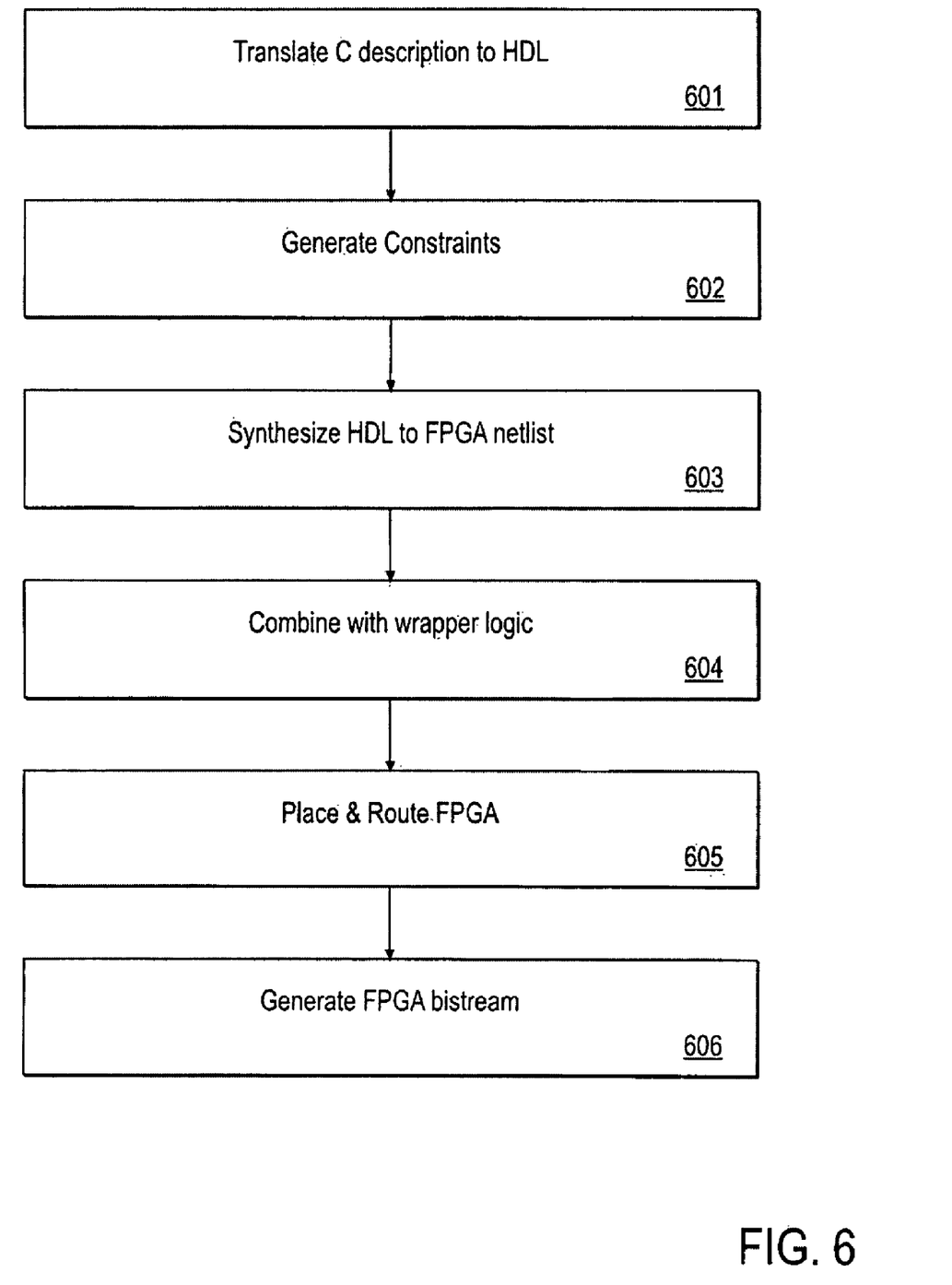
FIG. 6 is a flowchart showing a method for creating co-processor configuration to accelerate a specific algorithm, according to one embodiment.

With additional reference to FIG. 6, the process of generating user logic 306 is described. Co-processor module 200 may accelerate computational algorithms. These algorithms are typically described in a computer language such as C. Unfortunately, the C language is designed to execute on a sequential processor such as the Opteron from AMD or the Pentium from Intel. Using an FPGA co-processor directly to execute an algorithm described in the C language would offer little or no acceleration since it would not utilize the primary advantages of the co-processor. The primary advantages of an FPGA co-processor compared to a sequential processor are a vast amount of parallelism and a potentially much higher memory bandwidth. In order to use the FPGA efficiently, the initial C description must be translated into a hardware description language ("HDL"), such as VHDL or Verilog. This is shown in 601 of FIG. 6. Tools are available from companies such as Celoxica that do this translation. Additionally, there are variations of the C language such as UPC (unified parallel C) in which some parallelism is made visible to the user. These dialects of C may be translated more efficiently into FPGA co-processors.

At 602, constraints are generated for the user design. These include both physical and timing constraints. Physical constraints are necessary to ensure that user logic 306 connects correctly and does not conflict with support functions 300. Timing constraints determine the operating speed of user logic 306 and prevent other potential timing problems such as race conditions.

At 603, user logic 306 is synthesized. Synthesis converts the design from an HDL description to a netlist of FPGA primitives. The Xilinx tool XST may be used.

At 604, the user logic 306 is combined with the pre-designed support functions 300. The support functions 300, as well as wrapper interface 305 associated therewith, have a pre-assigned fixed placement so they may be combined with arbitrary user logic without affecting operation of support functions 300. Sections of the support functions 300 are very sensitive to timing and correct operation could not be guaranteed without fixing the placement.

At 605, the design for instantiation in user logic 306 is placed and routed. Placement and routing is performed by the appropriate FPGA software tools. These are available from the FPGA vendor. Constraints generated at 602 guide the place and route 605 as well as synthesis 603 to ensure that the desired speed and functionality are achieved.

At 606 a full or partial configuration pattern (or bitstream) for the FPGA is generated. This may be performed by a tool supplied by the FPGA vendor. The bitstream is then ready for download into co-processor FPGA 201.

While the foregoing describes exemplary embodiment(s) in accordance with one or more embodiments, other and further embodiment(s) in accordance with the one or more embodiments may be devised without departing from the scope thereof, which is determined by the claim(s) that follow and equivalents thereof. Claim(s) listing steps do not imply any order of the steps. Trademarks are the property of their respective owners.

What is claimed is:

1. A method for co-processing, comprising:
coupling an accelerator module to a microprocessor bus, the accelerator module including a Field Programmable Gate Array ("FPGA");
loading a microprocessor bus interface bitstream into the FPGA to program programmable logic thereof;
transferring data to first memory of the accelerator module via a microprocessor bus using a microprocessor bus interface instantiated in the FPGA responsive to the microprocessor bus interface bitstream;
instantiating a default configuration bitstream stored in the first memory in the FPGA to configure the FPGA to have the microprocessor bus interface with sufficient functionality to be recognized by a microprocessor coupled to the microprocessor bus; and
communicating under control of the microprocessor a configuration pattern to second memory of the accelerator module using a first memory interface instantiated in the FPGA responsive to the instantiating of the default configuration bitstream.

2. The method according to claim 1, wherein the loading is via a JTAG interface of the FPGA.

3. The method according to claim 2, wherein the loading and the transferring are under control of a Programmable Logic Device ("PLD"), the PLD being included as part of the accelerator module.

4. The method according to claim 1, further comprising sending control information from the microprocessor to the FPGA to indicate location of the configuration pattern in the second memory for instantiation in user programmable logic of the FPGA.

5. The method according to claim 4, wherein the control information is for partial reconfiguration of the user programmable logic of the FPGA.

6. The method according to claim 5, wherein the first memory is flash memory; and wherein the second memory is either Static Random Access Memory ("SRAM") or Dynamic Random Access Memory ("DRAM").

7. The method according to claim 1, wherein the microprocessor bus interface bitstream and the default configuration bitstream are instantiated in the FPGA with pre-assigned fixed placement.

8. A method for co-processing, comprising:
coupling an accelerator module to a microprocessor bus, the accelerator module including a Field Programmable Gate Array ("FPGA") and first memory, the first memory having a default configuration bitstream stored therein;
loading the default configuration bitstream into the FPGA to program programmable logic thereof, the default configuration bitstream including a microprocessor bus interface; and
configuring the FPGA with the default configuration bitstream with sufficient functionality to be recognized by a microprocessor coupled to the microprocessor bus; and
communicating under control of the microprocessor a configuration pattern to second memory using a first memory interface instantiated in the FPGA responsive to the configuring of the FPGA with the default configuration bitstream.

9. The method according to claim 8, wherein the loading is via a JTAG interface of the FPGA.

10. The method according to claim 9, wherein the loading is under control of a Programmable Logic Device ("PLD") included as part of the accelerator module.

11. The method according to claim 8, further comprising sending control information from the microprocessor to the FPGA to indicate location of the configuration pattern in the second memory for instantiation in user programmable logic of the FPGA.

12. The method according to claim 11, wherein the control information is for partial reconfiguration of the user programmable logic of the FPGA.

13. The method according to claim 12, wherein the first memory is flash memory; and wherein the second memory is either Static Random Access Memory ("SRAM") or Dynamic Random Access Memory ("DRAM").

14. The method according to claim 8, wherein the default configuration bitstream is instantiated in the FPGA with pre-assigned fixed placement.

* * * * *